United States Patent
Sato et al.

(10) Patent No.: US 9,123,881 B2
(45) Date of Patent: Sep. 1, 2015

(54) ELECTRONIC DEVICE AND ELECTRONIC APPARATUS

(71) Applicant: Seiko Epson Corporation, Tokyo (JP)

(72) Inventors: Kenji Sato, Matsumoto (JP); Norifumi Shimizu, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/864,470

(22) Filed: Apr. 17, 2013

(65) Prior Publication Data

US 2013/0279136 A1 Oct. 24, 2013

(30) Foreign Application Priority Data

Apr. 20, 2012 (JP) ................. 2012-096954

(51) Int. Cl.
| | | |
|---|---|---|
| H01L 41/047 | (2006.01) | |
| G01C 19/5783 | (2012.01) | |
| G01C 19/5628 | (2012.01) | |

(52) U.S. Cl.
CPC ........ H01L 41/0474 (2013.01); G01C 19/5628 (2013.01); G01C 19/5783 (2013.01)

(58) Field of Classification Search
CPC ........... G01C 19/5628; G01C 19/5783; H01L 41/0474; H01L 41/053; H03H 9/05
USPC ........................ 361/761; 174/262, 264–266
See application file for complete search history.

(56) References Cited

U.S. PATENT DOCUMENTS

| | | | | |
|---|---|---|---|---|
| 6,614,122 | B1* | 9/2003 | Dory et al. .................. | 257/787 |
| 6,984,866 | B1* | 1/2006 | Mostafazadeh et al. ...... | 257/433 |
| 7,157,836 | B2* | 1/2007 | Kinoshita ..................... | 310/348 |
| 7,557,491 | B2* | 7/2009 | Kigawa et al. ............... | 310/344 |
| 7,557,493 | B2* | 7/2009 | Fujimoto ..................... | 310/349 |
| 2004/0160145 | A1* | 8/2004 | Takeuchi et al. ............. | 310/348 |

FOREIGN PATENT DOCUMENTS

| | | |
|---|---|---|
| JP | 8-139129 | 5/1996 |
| JP | 9-193967 | 7/1997 |
| JP | 2000-106515 A | 4/2000 |
| JP | 2002-232252 A | 8/2002 |
| JP | 2002-319839 A | 10/2002 |
| JP | 2006-080672 A | 3/2006 |
| JP | 2011-129735 A | 6/2011 |
| WO | WO-2006043713 A1 | 4/2006 |

\* cited by examiner

*Primary Examiner* — Jenny L Wagner
*Assistant Examiner* — Michael P McFadden
(74) *Attorney, Agent, or Firm* — Harness, Dickey & Pierce, P.L.C.

(57) ABSTRACT

A sensor device includes an IC chip, a package which includes a base in which the IC chip is provided and houses the IC chip, the base having a through hole provided in a position that overlaps with the IC chip in the plan view, and a spacer which is provided between the IC chip and the base, and has an aperture communicating the through hole with the space on the opposite side to the base with respect to the IC chip in the package between the IC chip and the space.

11 Claims, 9 Drawing Sheets

ELECTRONIC DEVICE AND ELECTRONIC APPARATUS

BACKGROUND

1. Technical Field

The present invention relates to an electronic device and an electronic apparatus.

2. Related Art

As an electronic device which houses a mounting component in a package, for example, a piezoelectric device (sensor device) described in Pamphlet of International Publication WO. 2006/043713 has been known.

The piezoelectric device described in Pamphlet of International Publication WO. 2006/043713 includes a piezoelectric vibration piece, an IC (Integrated Circuit) chip, and a package which houses the piezoelectric vibration piece and the IC chip.

The package of the piezoelectric device has a package base having a concave portion and a lid which covers an opening of the concave portion of the package base and bonded to the package base.

Then, a sealing hole penetrating through the inner and outer surfaces is formed in the package base. The sealing hole is disposed shifted with respect to the installation area of the IC chip in order for the opening thereof not to be covered with the IC chip. Accordingly, after the piezoelectric vibration piece and the IC chip are housed in the package and the package base and the lid are bonded, it is possible to make the package have a reduced pressure state by blocking the sealing hole with the sealing material made of metal such as Au—Ge alloy under the reduced pressure.

However, in the piezoelectric device, since the sealing hole is provided in a position that does not overlap with the IC chip in a plan view, there is a problem that the size of the package increases. Further, since it is necessary to provide the sealing hole in a position which is significantly shifted with respect to the center of the package base, there is a problem that it results in a decrease in the mechanical strength of the package.

SUMMARY

An advantage of some aspects of the invention is to provide an electronic device and an electronic apparatus which can suppress a decrease in the mechanical strength of a package due to a through hole for reducing the pressure within the package or filling the package with an inert gas, and intend the miniaturization.

The invention can be implemented as the following forms or application examples.

APPLICATION EXAMPLE 1

This application example is directed to an electronic device including: a mounting component; a package which includes a base in which the mounting component is provided and houses the mounting component, the base having a through hole provided in a position that overlaps with the mounting component in a plan view; and a spacer which is provided between the mounting component and the base, and which communicates the through hole with a housing space in which the mounting component is housed.

With this configuration, in a state where the mounting component is provided in the base of the package, it is possible to reduce the pressure within the package or to fill the package with the inert gas through the through hole.

Particularly, since the through hole is formed in a position that overlaps with the mounting component in the plan view, it is possible to intend the miniaturization of the package and the miniaturization of the electronic device.

Further, since it is possible to provide the through hole on a central part side of the base, it is possible to suppress the decrease in a mechanical strength of the package due to the through hole.

APPLICATION EXAMPLE 2

In the electronic device according to the application example, it is preferable that the spacer has a plurality of projection portions that are provided at an interval in a circumferential direction of the through hole in the plan view of the base.

With this configuration, the distance between the mounting component and the base is restricted depending on the height of the plurality of projection portions, and an aperture is formed between two adjacent projection portions in the circumferential direction. Accordingly, the aperture can be formed which communicates the through hole with a space on a side opposite to the base with respect to the mounting component in the package, between the mounting component and the base.

APPLICATION EXAMPLE 3

In the electronic device according to the application example, it is preferable that at least one of the plurality of projection portions is configured of a metal layer that is provided in the base, and the mounting component is bonded to the at least one of the plurality of projection portions through an adhesive agent.

The projection portion configured of the metal layer can be simply and very accurately formed using a known deposition method. Further, it is possible to simply and strongly bond the mounting component and the projection portion by an adhesive agent.

APPLICATION EXAMPLE 4

In the electronic device according to the application example, it is preferable that the electronic device further includes a wall portion which is provided between the mounting component and the base, and is disposed between the spacer and the through hole in the plan view of the base.

With this configuration, it is possible to prevent the adhesive agent supplied to the spacer from flowing into the through hole using the wall portion.

APPLICATION EXAMPLE 5

In the electronic device according to the application example, it is preferable that the wall portion is lower than the height of the spacer.

With this configuration, it is possible to form an aperture which communicates the through hole with a space on the opposite side to the base with respect to the mounting component in the package between the mounting component and the base, and to prevent the adhesive agent supplied to the spacer from flowing into the through hole using the wall portion.

APPLICATION EXAMPLE 6

In the electronic device according to the application example, it is preferable that the wall portion has a plurality of wall bodies that are provided at an interval in a circumferential direction of the through hole in the plan view of the base.

With this configuration, it is possible to form an aperture which communicates the through hole with a space on the opposite side to the base with respect to the mounting component in the package between the mounting component and the base, and to prevent the adhesive agent supplied to each projection portion from flowing into the through hole by the plurality of wall bodies.

APPLICATION EXAMPLE 7

In the electronic device according to the application example, it is preferable that the plurality of wall bodies include a first wall portion that is configured of a plurality of wall bodies that are provided at an interval in a circumferential direction of the through hole in the plan view of the base, and a second wall portion that is configured of a plurality of wall bodies that are provided inside the first wall portion and provided at an interval in a circumferential direction of the through hole in the plan view of the base, and at least one of the wall bodies of the first wall portion and the wall bodies of the second wall portion are disposed in a radius direction centered on the through hole in the plan view of the base.

With this configuration, it is possible to elongate the length of a path to which the adhesive agent flows. Therefore, it is possible to more surely prevent the adhesive agent supplied to each projection portion from flowing into the through hole by the first wall portion and the second wall portion.

APPLICATION EXAMPLE 8

In the electronic device according to the application example, it is preferable that the mounting component is an IC chip.

Recently, whereas the IC chip tends to increase in size according to the multi-functions and the like, there is a demand for miniaturization of electronic devices. Therefore, in a case where the mounting component is the IC chip, the effect obtained by applying an embodiment of the invention becomes remarkable.

APPLICATION EXAMPLE 9

In the electronic device according to the application example, it is preferable that in the IC chip, a surface on a side opposite to an active surface is fixed to the base with the spacer interposed therebetween.

With this configuration, it is possible to prevent splashes from adversely affecting the active surface of the IC chip when the through hole is sealed with the sealing material.

APPLICATION EXAMPLE 10

In the electronic device according to the application example, it is preferable that the electronic device further includes a sensor element which is housed in the package, and the IC chip has a function of driving the sensor element.

In general, the package which houses the sensor element is in a state where the pressure is reduced or the inert gas is filled. Accordingly, the effect obtained by applying an embodiment of the invention becomes remarkable. Further, since the through hole is formed in a position that overlaps with the mounting component (IC chip) in the plan view, it is possible to prevent splashes from adversely affecting the sensor element when the through hole is sealed with the sealing material. Furthermore, since the through hole is provided on the central part side of the base of the package, it is possible to reduce the stress generated in the package, and thus the sensor element is made to have excellent detection sensitivity.

APPLICATION EXAMPLE 11

In the electronic device according to the application example, it is preferable that the electronic device has an annular wall body which encloses an entire circumference around the through hole in the plan view of the base.

With this configuration, it is possible to prevent the adhesive agent supplied to the spacer from flowing into the through hole by the annular wall body.

APPLICATION EXAMPLE 12

This application Example is directed to an electronic apparatus including the electronic device according to the application example.

In this case, it is possible to provide an electronic apparatus having an excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic device and an electronic apparatus of the invention will be described in detail based on the embodiments shown in appended drawings. Further, hereinafter, a case where the electronic device of the invention is applied to a sensor device is described as an example, but without being limited thereto, the invention can be applied to various electronic devices which each houses a mounting component in a package.

Electronic Device

First Embodiment

At first, a description of the first embodiment of the electronic device of the invention will be given.

Figure 1:
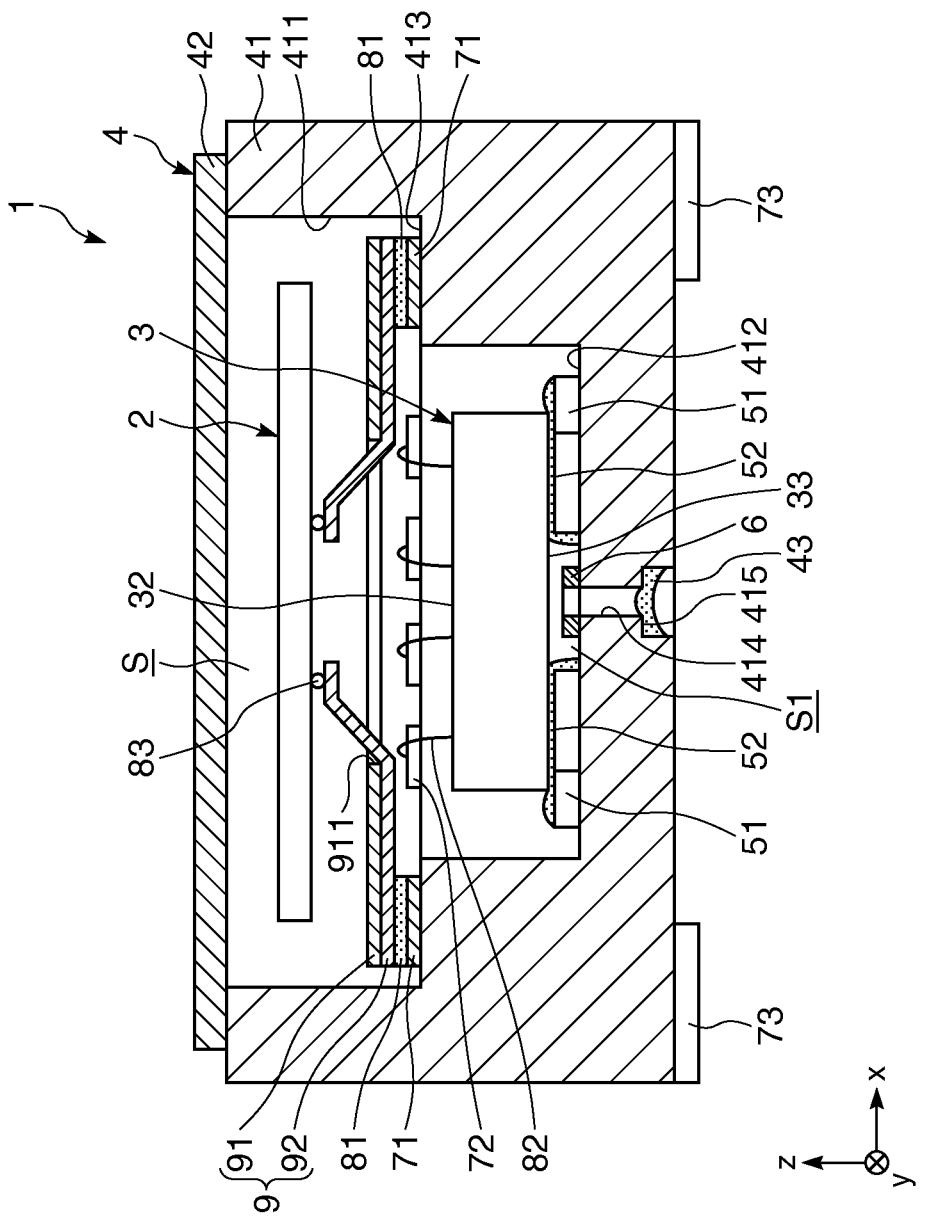
FIG. 1 is a cross-sectional view illustrating a schematic configuration of a sensor device (electronic device) relating to a first embodiment of the invention.
Figure 2:
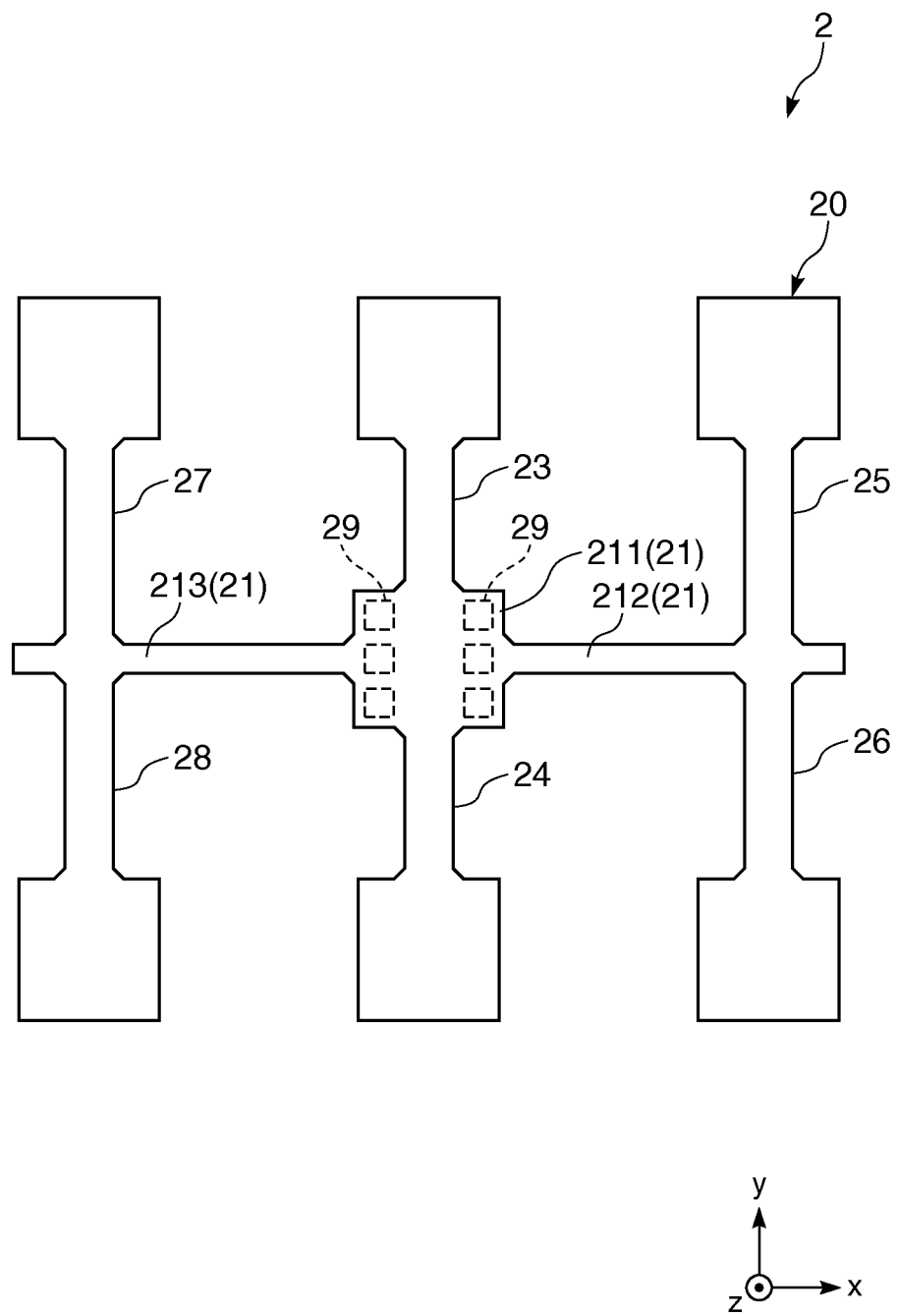
FIG. 2 is a plan view illustrating a sensor element of the sensor device shown in FIG. 1.
Figure 3:
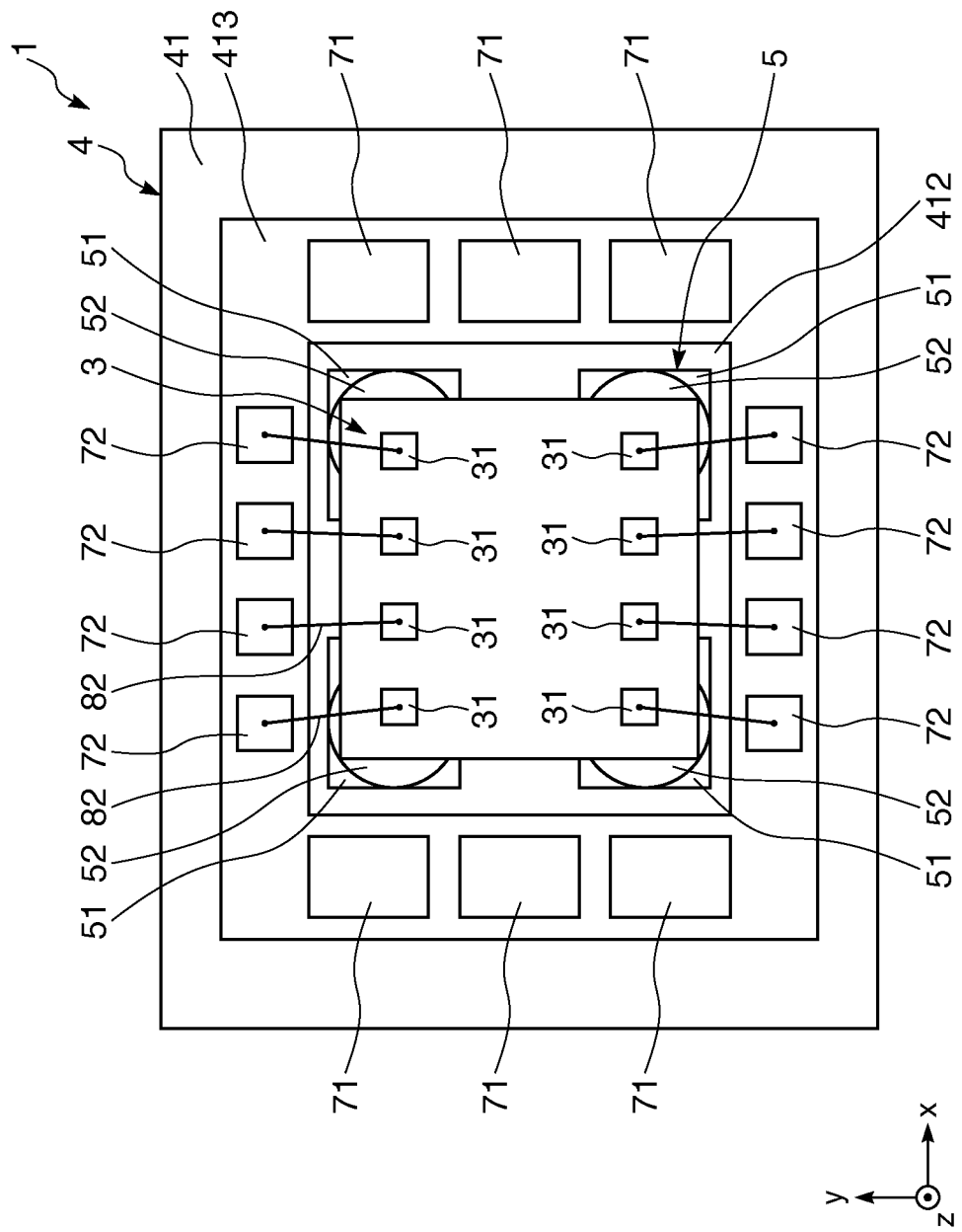
FIG. 3 is a plan view illustrating an IC chip (mounting component) of the sensor device shown in FIG. 1.
Figure 4:
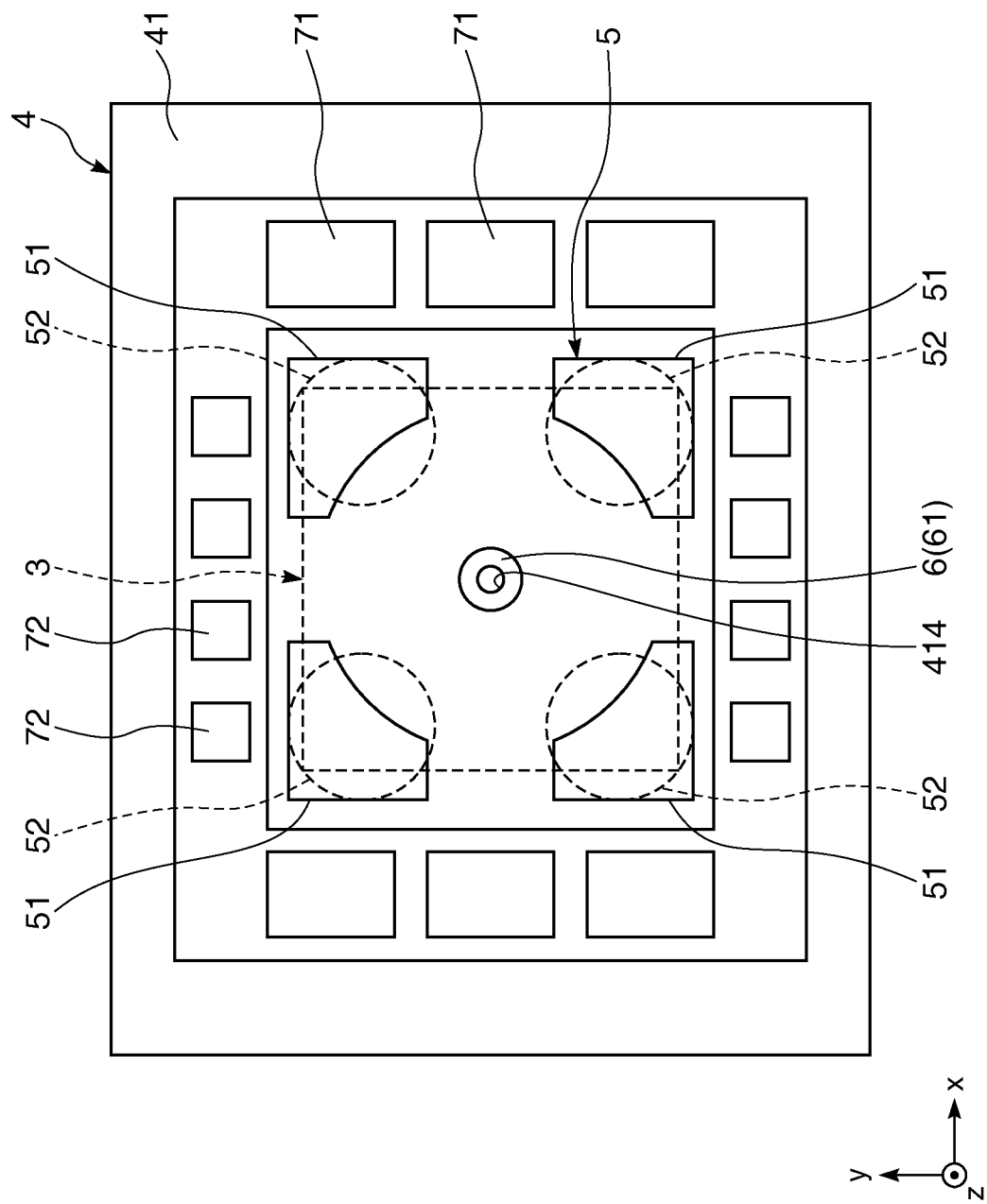
FIG. 4 is a plan view illustrating a base of a package of the sensor device shown in FIG. 1.

FIG. 1 is a cross-sectional view illustrating a schematic configuration of a sensor device (electronic device) relating to the first embodiment of the invention, FIG. 2 is a plan view illustrating a sensor element of the sensor device shown in FIG. 1, FIG. 3 is a plan view illustrating an IC chip (mounting component) of the sensor device shown in FIG. 1, and FIG. 4 is a plan view illustrating a base of a package of the sensor device shown in FIG. 1.

Further, hereinafter, for convenience of explanation, in FIGS. 1 to 4, x axis, y axis and z axis are shown as three axes that are orthogonal to each other, and the leading end sides of the illustrated arrows are set to "+ side", the proximal end sides of the arrows are set to "– side." Hereinafter, the direction parallel to x axis is referred to as "x axis direction", the direction parallel to y axis is referred to as "y axis direction", and the direction parallel to z axis is referred to as "z axis direction", in addition, +z side (the upper side in FIG. 1) is referred to as "up", and –z side (the lower side in FIG. 1) is referred to as "down".

The sensor device 1 (electronic device) shown in FIG. 1 and FIG. 2 is a gyro sensor which detects an angular velocity. The sensor device 1 has a sensor element 2, an IC chip 3 (mounting component) and a package 4 which houses the sensor element 2 and the IC chip 3.

Sensor Element

The sensor element 2 is an "out-of-plane detection type" sensor element (vibration piece) which detects the angular velocity around the z axis. As shown in FIG. 2, the sensor element 2 includes a vibrating body 20 having a plurality of vibrating arms, a plurality of excitation electrodes (not shown) provided on the surface of the vibrating body 20, a plurality of detection electrodes (not shown) and a plurality of terminals 29.

Hereinafter, each of portions constituting the sensor device 2 will be sequentially described.

Vibration Piece

First, the vibrating body 20 will be described.

The vibrating body 20 has a structure called as a double T type.

To more specific, the vibrating body 20 has a base portion 21, two detection vibrating arms (second vibrating arms) 23 and 24 extended from the base portion 21 and four drive vibrating arms (first vibrating arms) 25 to 28.

The base portion 21 includes a main body portion 211, and a pair of connecting arms 212 and 213 extended to the sides opposite to each other along the x axis direction from the main body portion 211.

The detection vibrating arms 23 and 24 are extended to the direction opposite to each other along the y axis direction from the main body portion 211 of the base portion 21.

The drive vibrating arms 25 and 26 are extended to the direction opposite to each other along the y axis direction from the leading end portion of the connecting arm 212 of the base portion 21.

The drive vibrating arms 27 and 28 are extended to the directions opposite to each other along the y axis direction from the leading end portion of the connecting arm 213 of the base portion 21.

The vibrating body 20 is made of piezoelectric material, and without being illustrated, in the detection vibrating arms 23 and 24, there are provided a plurality of detection electrodes (detection signal electrode and detection ground electrode) which detect charges generated according to the flexural vibration of the detection vibrating arms 23 and 24. In addition, in the drive vibrating arms 25 to 28, there are provided a plurality of excitation electrodes (drive signal electrode and drive ground electrode) which respectively cause the drive vibrating arms 25 to 28 to be flexurally vibrated by energization.

Examples of the piezoelectric material include quartz crystal, lithium tantalate, lithium niobate, lithium borate, barium titanate, and the like. In particular, it is preferable that piezoelectric material constituting the vibrating body 20 is quartz crystal (X-cut plate, AT-cut plate, Z-cut plate, etc.). If the vibrating body 20 is made of crystal, the vibration characteristic (in particular, frequency temperature characteristic) of the vibrating body 20 can be excellent. Moreover, it is possible to form the vibration body 20 with high dimensional accuracy by etching.

Further, the vibrating body 20 may be made of non-piezoelectric material such as silicon, quartz, and the like. In this case, the piezoelectric elements which detect charges generated according to the flexural vibration of the detection vibrating arms 23 and 24 may be respectively provided in the detection vibrating arms 23 and 24, and the piezoelectric elements which cause the drive vibrating arms 25 to 28 to be flexurally vibrated by energization may be respectively provided in the drive vibrating arm 25 to 28.

Terminal

A plurality of terminals 29 are provided on the main body portion 211 of the aforementioned base portion 21.

In the embodiment, six terminals 29 are provided on the main body portion 211. Without being illustrated, but two terminals 29 out of the six terminals 29 are electrically connected to a plurality of excitation electrodes of each of the drive vibrating arms 25 to 28 through wirings on the vibrating body 20. Further, among four remaining terminals 29, two terminals 29 are electrically connected to a plurality of detection electrodes of the detection vibrating arm 23 through wirings on the vibrating body 20, and the other two terminals 29 are electrically connected to a plurality of detection electrodes of the detection vibrating arm 24 through wirings on the vibrating body 20.

Further, each terminal 29 and wiring (not shown) and the like can be made of metal material such as, for example, gold (Au), gold alloy, platinum (Pt), aluminum (Al), aluminum alloy, silver (Ag), silver alloy, chromium (Cr), chrome alloy, copper (Cu), molybdenum (Mo), niobium (Nb), tungsten (W), iron (Fe), titanium (Ti), cobalt (Co), zinc (Zn), zirconium (Zr), and transparent electrode material such as ITO and ZnO. Further, the terminal and the wiring can be integrally formed with the detection electrode and the excitation electrode at the same time.

The sensor element 2 configured in this manner detects the angular velocity ω around z axis as follows.

Firstly, the drive signal is applied to the excitation electrode (drive signal electrode), whereby the drive vibrating arm 25 and the drive vibrating arm 27 are caused to perform flexural vibration (drive vibration) in order to move toward or away from each other, and the drive vibrating arms 26 and the drive vibrating arms 28 are caused to perform flexural vibration (drive vibration) in order to move toward or away from each other in the same direction as the above flexural vibration.

In this case, if the angular velocity is not applied to the sensor element 2, since the drive vibrating arms 25 and 26 and the drive vibrating arms 27 and 28 perform a plane symmetric vibration with respect to the yz plane passing through the center point (center of gravity), the proximal portion 21 (main body portion 211 and connecting arms 212 and 213), and the detection vibrating arms 23 and 24 almost do not vibrate.

In this manner, in a state where the drive vibrating arms 25 to 28 are caused to drive and vibrate, if the angular velocity ω around the normal line passing through the center of gravity is applied to the sensor element 2, Coriolis force acts on each of the drive vibrating arms 25 to 28. Thus, the connecting arms 212 and 213 are caused to flexurally vibrate, and then the flexural vibration (detection vibration) of the detection vibrating arms 23 and 24 is excited in order to cancel the above flexural vibration.

Then, the charges generated due to the flexural vibrations of the detection vibrating arms 23 and 24 are output from the detection electrode (detection signal electrode).

In this manner, it is possible to obtain the angular velocity ω applied to the sensor element 2 based on the charges that are output from the detection electrode.

A plurality of terminals 29 of the sensor element 2, each is electrically connected to the wiring 92 of the supporting member 9 shown in FIG. 1 through a conductive bump 83 shown in FIG. 1. Then, the sensor element 2 is fixed and supported in the package 4 through the supporting member 9.

IC Chip

The IC chip 3 shown in FIG. 1 and FIG. 3 is an electronic component (mounting component) having a function of driving the aforementioned sensor element 2 and a function of detecting the output (sensor output) from the sensor element 2.

Without being illustrated, the IC chip 3 includes a driving circuit which drives the sensor element 2 and a detection circuit which detects an output (charges) from the sensor element 2. The driving circuit and the detection circuit are provided in the active surface 32 (upper surface) of the IC chip 3.

The active surface 32 (upper surface) of the IC chip 3 has a plurality of connection terminals 31 provided therein.

Package

The package 4 houses the sensor element 2 and the IC chip 3.

As shown in FIG. 1, the package 4 includes a base 41 having a concave portion 411 that is open toward the upper surface, and a lid 42 (cap) bonded to the base 41 so as to cover the opening of the concave portion 411 of the base 41. The package 4 has a housing space S inside thereof, and the sensor element 2 and the IC chip 3 are hermetically housed and provided inside the housing space S.

In the embodiment, in the plan view, the base 41 is disposed such that the sensor element 2 and the IC chip 3 overlap. That is, in a state where the sensor element 2 and the IC chip 3 are aligned in the z axis direction, the sensor element 2 and the IC chip 3 are housed in the package 4.

In a case where the sensor element 2 and the IC chip 3 are disposed in this manner, it is possible to reduce the size of the package 4 in the x-axis direction and the y-axis direction, thereby downsizing the sensor device 1.

Further, the sensor element 2 is provided on the opposite side to the base 41 with respect to the IC chip 3. Accordingly, when the through hole 414 described later is sealed with a sealing material 43, it is possible to prevent splashes from adversely affecting the sensor element 2.

The side surface of the concave portion 411 of the base 41 is formed in a stepwise manner.

For example, the base 41 is configured by laminating a first plate-shaped substrate, a second frame-shaped substrate, and a third frame-shaped substrate having an opening larger than the opening of the second substrate in this order.

As configuration material of the base 41, without being particularly limited, it is possible to use, for example, various ceramics such as aluminum oxide.

Further, a through hole 414 is provided in the base 41, which is used in reducing the pressure within the housing space or filling the housing space with the inert gas. The through hole 414 is sealed with the sealing material 415.

For example, in a case of reducing the pressure within the housing space S, firstly, the air inside the housing space S is eliminated through the through hole 414 before being sealed with the sealing material 415, and then while keeping the state, the metal ball as the sealing material 415 is placed inside the through hole 414 and melted by laser, whereby the sealing material 415 is formed and the through hole 414 is sealed.

The through hole 414 is provided in a position that overlaps with the IC chip 3 in a plan view.

In particular, the through hole 414 penetrates through the base 41 in the thickness direction in order to open toward the lower surface 412 of the concave portion 411. Then, the IC chip 3 is provided in the lower surface 412 of the concave portion 411 of the base 41 with the spacer 5 interposed therebetween.

The spacer 5 is provided between the IC chip 3 and the base 41. Then, in the spacer 5, an aperture S1 is formed which communicates the through hole 414 with the space on the side opposed to the base 41 with respect to the IC chip inside the package 4 between the IC chip 3 and the base 41.

Accordingly, in a state where the IC chip 3 is provided in the base 41 of the package 4, since the through hole 414 is communicated with the housing space S, it is possible to reduce the pressure within the package 4 or to fill the package 4 with the inert gas through the through hole 414.

Particularly, the through hole 414 is formed in a position that overlaps with the IC chip 3 in the plan view, so that it is possible to intend the miniaturization of the package 4 and the miniaturization of the sensor device 1.

Further, the through hole 414 can be provided in the central part side of the base 41, thus it is possible to suppress a decrease in the mechanical strength of the package 4 due to the through hole 414.

Recently, whereas the IC chip tends to increase in size according to the multi-functions and the like, there is a demand for miniaturization of electronic devices. Therefore, as described above, in a case where the through hole 414 is formed in a position that overlaps with the IC chip 3 in the plan view, the effect obtained by applying the invention (effect obtained by forming the aperture S1 by the spacer 5) becomes remarkable.

Further, in the embodiment, a surface (a rear surface 33) on the opposite side to the active surface 32 of the IC chip 3 is fixed to the base 41 with the spacer 5 interposed therebetween. This enables to prevent splashes from adversely affecting the active surface 32 of the IC chip 3 when the through hole 414 is sealed with the sealing material 415.

Further, in general, in the package which houses the sensor element, it is possible to make the inside of the package the pressure reduced state or the inert gas filled state. Therefore, in the sensor device 1, the effect obtained by applying the invention becomes remarkable. Further, since through hole 414 is formed in a position that overlaps with the IC chip 3 in a plan view, it is possible to prevent splashes from adversely affecting the sensor element 2 when the through hole 414 is sealed with the sealing material 415. Moreover, the through hole 414 is formed in the central part of the base 41 of the package 4, it is possible to reduce the stress generated in the package 4, and thus the sensor element 2 is made to have excellent detection sensitivity.

If a more detailed description of the spacer 5 is given, in the plan view of the base 41, the spacer 5 has a plurality of projection portions 51 that are provided and aligned at an interval in a circumferential direction of the through hole 414. Accordingly, a distance between the IC chip 3 and the base 41 is restricted depending on the heights of the plurality of projection portions 51, and an aperture is formed between two adjacent projection portions 51 in the circumferential direction. Therefore, it is possible to form an aperture S1 which communicates the through hole 414 with the space on the opposite side to the base 41 with respect to the IC chip 3 in the package 4 between the IC chip 3 and the base 41.

Each projection portion 51 is configured of a metal layer formed in the base 41. Then, the IC chip 3 is bonded to each projection portion 51 through an adhesive agent 52.

Each projection portion 51 that is configured of the metal layer can be formed simply and accurately using a known deposition method. Further, the IC chip 3 and each projection portion 51 can be simply and strongly bonded by the adhesive agent 52.

As configuration materials of each projection portion 51, without being specially limited, it is possible to use various metal materials, but it is preferable to use the same material as the internal terminals 71 and 72. This enables to integrally form the plurality of projection portions 51 and the internal terminals 71 and 72.

Further, the thickness (height) of each projection portion 51 is different depending on the viscosity, the usage, the used place and the like of the used adhesive agent 52, without being particularly limited, and is preferably, for example, 0.01 mm or more and 0.1 mm or less.

The adhesive agent 52 is configured of including, for example, an epoxy resin, an acrylic resin, and the like.

Further, the wall portion 6 is provided in the vicinity of the through hole 414 in the lower surface 412.

The wall portion 6 is provided between the IC chip 3 and the base 41. Then in the plan view of the base 41, the wall portion 6 is placed between a plurality of projection portions 51 and the through hole 414. Accordingly, when each projection portion 51 and the IC chip 3 are bonded through the adhesive agent 52, it is possible to prevent the adhesive agent 52 supplied to each projection portion 51 from flowing into the through hole 414 using the wall portion 6.

Further, the wall portion 6 is formed lower than the height of each projection portion 51, and in the plan view of the base 41, the wall portion 6 is configured of an annular wall body 61 that is formed by enclosing the entire circumference around the through hole 414.

Accordingly, it is possible to form an aperture S1 between the IC chip 3 and the base 41, which communicates the through hole 414 with the space on the opposite side to the base 41 with respect to the IC chip 3 in the package 4, and to prevent the adhesive agent 52 supplied to each projection portion 51 from flowing into the through hole 414 by the annular wall body 61.

The thickness (height) of the annular wall body 61 is thinner (lower) than the thickness (height) of each projection portion 51, but it is preferable that the thickness (height) of the annular wall body 61 be about $1/3$ to $2/3$ with respect to the thickness of each projection portion 51.

In addition, the annular wall body 61 is configured of a metal layer.

As configuration material of the annular wall body 61, without being specially limited, various metal materials can be used, but the annular wall body 61 can be configured of the same material as the internal terminals 71 and 72 described later. This enables to integrally form the annular wall body 61 and the internal terminals 71 and 72.

Further, a plurality of internal terminals 71 and a plurality of internal terminals 72 are provided in the step portion 413 that is formed in the side surface of the concave portion 411. Then, a sensor element 2 is provided in the step portion 413 through the plurality of internal terminals 71 and the supporting member 9.

As shown in FIG. 1, the supporting member 9 is fixed in the plurality of internal terminals 71 through a conductive fixing member 81 that is configured of a solder, a silver paste, a conductive adhesive agent (adhesive agent having conductive filler such as metal particles dispersed in resin material), and the like.

The supporting member 9 has a function of supporting the sensor element 2, and electrically connecting the sensor element 2 with the plurality of internal terminals 71.

The supporting member 9 is configured of so-called a TAB tape having an insulation film 91 and a plurality of wirings 92 that are bonded on the film 91.

The film 91 is configured of resin material, for example, polyimide, and the like. Further, each wiring 92 is configured of, for example, metal material such as copper.

A device hole 911 is formed in the central part of the film 91, and each wiring 92 is extended from the above of the film 91 toward the device hole 911 side, and the extended part is bended to the film 91 side (opposite side to the IC chip 3).

The plurality of wirings 92 are provided corresponding to the plurality of terminals 29 and the plurality of internal terminals 71 of the aforementioned sensor element 2. Then, the proximal end portion of each wiring 92 is bonded with respect to the corresponding internal terminal 71 through the conductive fixing member 81. Further, the leading end portion of each wiring 92 is bonded with respect to the corresponding terminal 29 through the bump 83. In this manner, each terminal 29 of the sensor element 2 is electrically connected to the internal terminal 71 through the corresponding bump 83, wiring 92 and conductive fixing member 81, and the sensor element 2 is supported in the base 41 through the supporting member 9.

The plurality of internal terminals 71 are electrically connected to the plurality of internal terminals 72 through wiring, not shown.

A plurality of connection terminals 31 of the aforementioned IC chip 3 are electrically connected respectively to the plurality of internal terminals 72 through the wiring 82 configured of, for example, bonding wire.

Further, a plurality of external terminals 73 are provided in the lower surface of the base 41 (the lower surface of the package 4) to be used when the sensor device 1 is mounted on an apparatus (external apparatus) in which the sensor device 1 is incorporated.

The plurality of external terminals 73 are electrically connected to the aforementioned internal terminal 72 through an internal wiring, not shown.

The internal terminals 71, 72, and the like are made of a metal film in which a coating such as nickel (Ni) and gold (Au) is laminated to a metallization layer such as tungsten (W) by plating, and the like.

The lid 42 is hermetically bonded to the base 41. Thus, the inside of the package 4 is hermetically sealed.

The lid 42 is made of, for example, the same material as the base 41, or, metal such as kovar, 42 alloy and stainless steel.

As a bonding method of the base 41 and the lid 42, without being specially limited, for example, a bonding method by an adhesive agent configured of brazing filler metal, curing resin, and the like, and a welding method such as a seam welding, a laser welding, and the like can be used.

According to the sensor device 1 relating to the first embodiment described hitherto, in the spacer 5, the aperture S1 is formed between the IC chip 3 and the base 41, which communicates the through hole 414 with the space on the opposite side to the base 41 with respect to the IC chip in the package 4, so that in a state where the IC chip 3 is provided in the base 41 of the package 4, it is possible to reduce the pressure within the package 4 or to fill the package 4 with the inert gas through the through hole 414.

Particularly, since the through hole 414 is provided in a position that overlaps with the IC chip 3 in the plan view, the miniaturization of the package 4, and the miniaturization of the sensor device 1 can be intended.

Further, since the through hole 414 can be provided in the central part side of the base 41, it is possible to suppress a decrease in the mechanical strength of the package 4 due to the through hole 414.

Second Embodiment

Next, a description of a second embodiment of the electronic device of the invention will be given.

Figure 5:
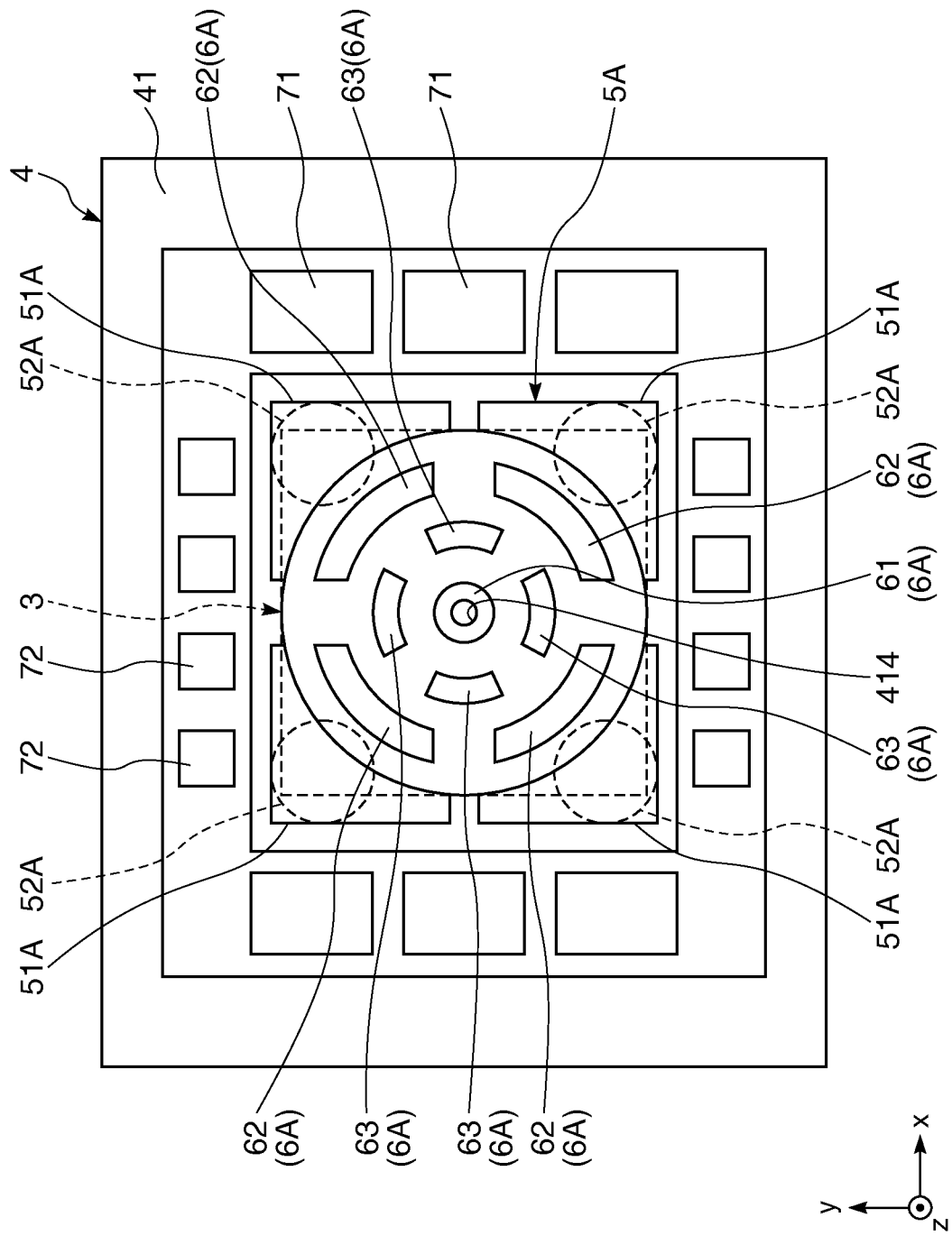
FIG. 5 is a plan view illustrating a base of a package of a sensor device (electronic device) relating to a second embodiment of the invention.

FIG. 5 is a plan view illustrating a base of a package of a sensor device (electronic device) relating to the second embodiment of the invention.

Hereinafter, the electronic device of the second embodiment will be described focusing on differences from the embodiment described above, and the description of the same matters will be omitted.

The electronic device relating to the second embodiment of the invention has the same configuration as the aforementioned first embodiment except for a different configurations of the spacer and the wall portion that are provided between the base of the package and the mounting component. Further, the same configurations as the aforementioned first embodiment are denoted by the same reference numerals.

As shown in FIG. 5, the sensor device (electronic device) of the embodiment has a spacer 5A and a wall portion 6A.

The spacer 5A is provided between the IC chip 3 and the base 41. The spacer 5A has a plurality of projection portions 51A that are provided and aligned at an interval in the circumferential direction of the through hole 414 in the plan view of the base 41. Then, the IC chip 3 is bonded to each projection portion 51A through an adhesive agent 52A.

In the spacer 5A, the aperture is formed between the IC chip 3 and the base 41, which communicates the through hole 414 with the space on the opposite side to the base 41 with respect to the IC chip in the package 4.

The wall portion 6A includes an annular wall body 61 and a plurality of wall bodies 62 and 63 that are formed and aligned at an interval in the circumferential direction of the through hole 414 in the plan view of the base 41. Accordingly, it is possible to form an aperture S1 between the IC chip 3 and the base 41, which communicates the through hole 414 with the space on the opposite side to the base 41 with respect to the IC chip 3 in the package 4, and to prevent the adhesive agent 52A supplied to each projection portion 51A from flowing into the through hole 414 using the annular wall body 61 and the plurality of wall bodies 62 and 63.

The plurality of wall bodies 62 (first wall portion) are provided and aligned in a circumferential direction of the through hole 414 in the plan view of the base 41, and the plurality of wall bodies 63 (second wall portion) are provided inside the plurality of wall bodies 62 and provided and aligned at an interval in a circumferential direction of the through hole 414 in the plan view of the base 41.

Then, the plurality of wall bodies 62 and the plurality of wall bodies 63 are disposed such that the aperture between two adjacent wall bodies 62 in a circumferential direction and the aperture between two wall bodies 63 that are adjacent with each other in a circumferential direction do not overlap in the circumferential direction. That is in the plan view of the base 41, the wall body on at least one of the wall bodies 62 and the wall bodies 63 is disposed in a radius direction centered on the through hole 414.

By disposing the plurality of wall bodies 62 and 63 in this manner, it is possible to elongate the length of a path to which the adhesive agent 52A flows. Therefore, it is possible to more surely prevent the adhesive agent 52A supplied to the projection portion 51A from flowing into the through hole 414 by the plurality of wall bodies 62 and 63.

It is preferable that the thicknesses (heights) of each wall bodies 62 and 63 be the same as or slightly thicker (higher) than the thicknesses (heights) of each projection portion 51A. This enables to suppress the distance between the IC chip 3 and the base 41 by the plurality of wall bodies 62 and 63. Therefore, when the projection portion 51A and the IC chip 3 are bonded by the adhesive agent 52A, it is possible to suppress the amount of the adhesive agent 52A flowing into the through hole 414 side.

Further, each of the wall bodies 62 and 63 is configured of a metal layer.

As configuration materials of each of the wall bodies 62 and 63, without being specially limited, it is possible to use various metal materials, but it is preferable to use the same material as the internal terminals 71 and 72. This enables to integrally form the wall bodies 62 and 63 and the internal terminals 71 and 72.

Even in the sensor device of the second embodiment, it is possible to suppress a decrease in the mechanical strength of the package due to the through hole for reducing the pressure within the package or filling the package with the inert gas, and to intend the miniaturization.

Third Embodiment

Next, a description of a third embodiment of the electronic device of the invention will be given.

Figure 6:
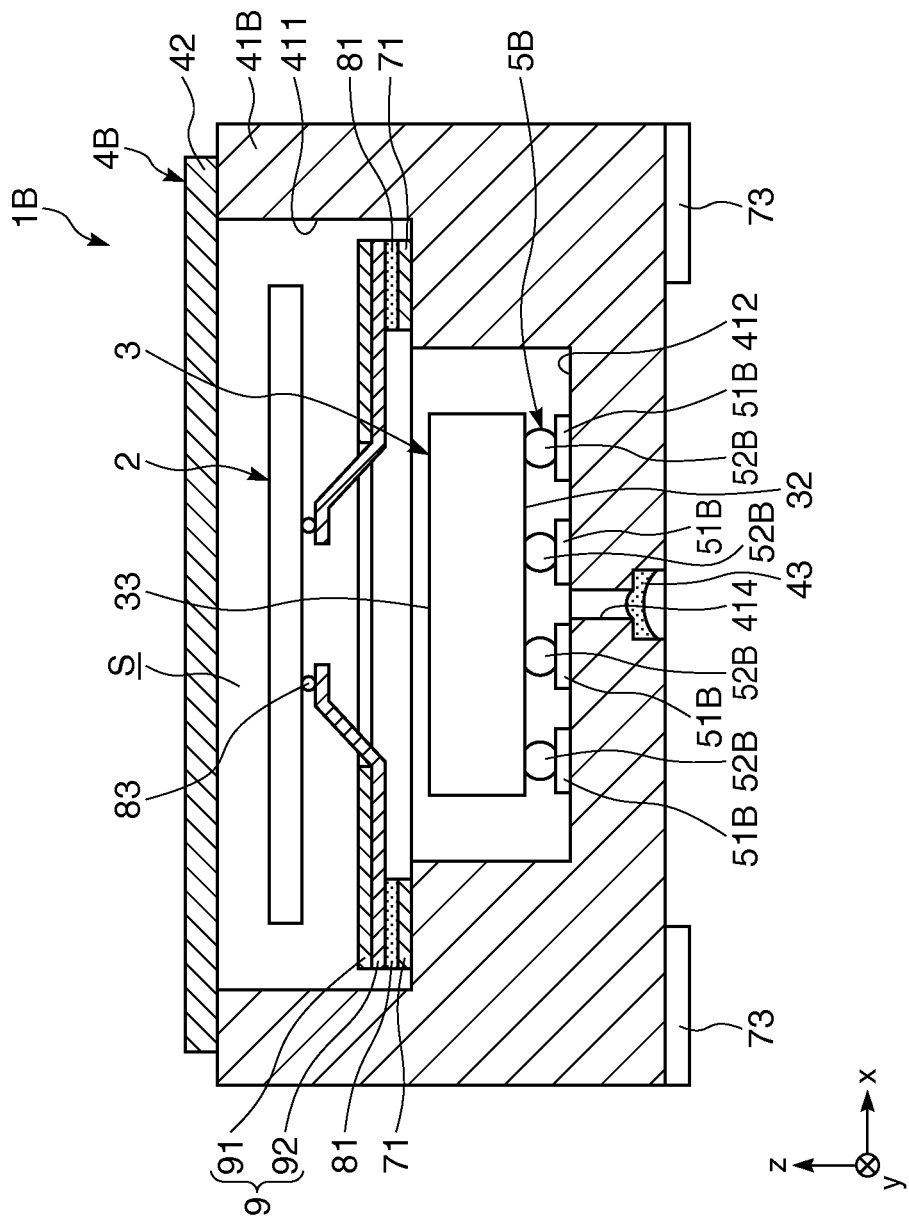
FIG. 6 is a cross-sectional view illustrating a schematic configuration of a sensor device (electronic device) relating to a third embodiment of the invention.

FIG. 6 is a cross-sectional view illustrating a schematic configuration of a sensor device (electronic device) relating to the third embodiment of the invention.

Hereinafter, the electronic device of the third embodiment will be described focusing on differences from the embodiment described above, and the description of the same matters will be omitted.

The electronic device relating to the third embodiment of the invention has the same configuration as the aforementioned first embodiment except for a configuration of the package in accordance with the face-down mounting of mount components, and a different configuration of the spacer that is provided between the base of the package and the mounting component. Further, the same configurations as the aforementioned first embodiment are denoted by the same reference numerals.

The sensor device (electronic device) 1B of the embodiment has, as shown in FIG. 6, the package 4B which houses the sensor element 2 and the IC chip 3.

The package 4B includes a base 41B having a concave portion 411 that is open toward the upper surface, and a lid 42 (cap) bonded to the base 41B so as to cover the opening of the concave portion 411 of the base 41B.

The through hole 414 that is used when reducing the pressure within the package 4B or filling the inside of the package 4B with the inert gas is formed in the base 41B.

Further, IC chip 3 is placed on the lower surface 412 of the concave portion 411 of the base 41B with the spacer 5B interposed therebetween. In the spacer 5B, an aperture is formed between the IC chip 3 and the base 41, which communicates the through hole 414 with the space on the opposite side to the base 41 with respect to the IC chip in the package 4.

In the embodiment, the active surface of the IC chip 3 is fixed to the base 41 with the spacer 5B interposed therebetween.

The spacer 5B has a plurality of internal terminals 51B and a plurality of bumps 52B.

The plurality of internal terminals 51B are provided spaced from each other corresponding to a plurality of connection terminals of the IC chip 3. Then, each internal terminal 51B is electrically connected to the connection terminal of the corresponding IC chip 3 through the bump 52B.

A part of the plurality of internal terminals 51B is electrically connected to the plurality of internal terminals 71 through wiring, not shown, a remaining part is electrically connected to the plurality of external terminals 73.

Even in the sensor device 1B of the third embodiment described hitherto, it is possible to suppress a decrease in the mechanical strength of the package due to the through hole for reducing the pressure within the package or filling the package with the inert gas, and to intend the miniaturization.

Electronic Apparatus

The sensor device (electronic device) described hitherto is incorporated to various electronic apparatuses, and thus it is possible to provide an electronic apparatus excellent in reliability.

Hereinafter, an example of an electronic apparatus including the electronic device of the invention will be described in detail based on FIGS. 7 to 9.

Figure 7:
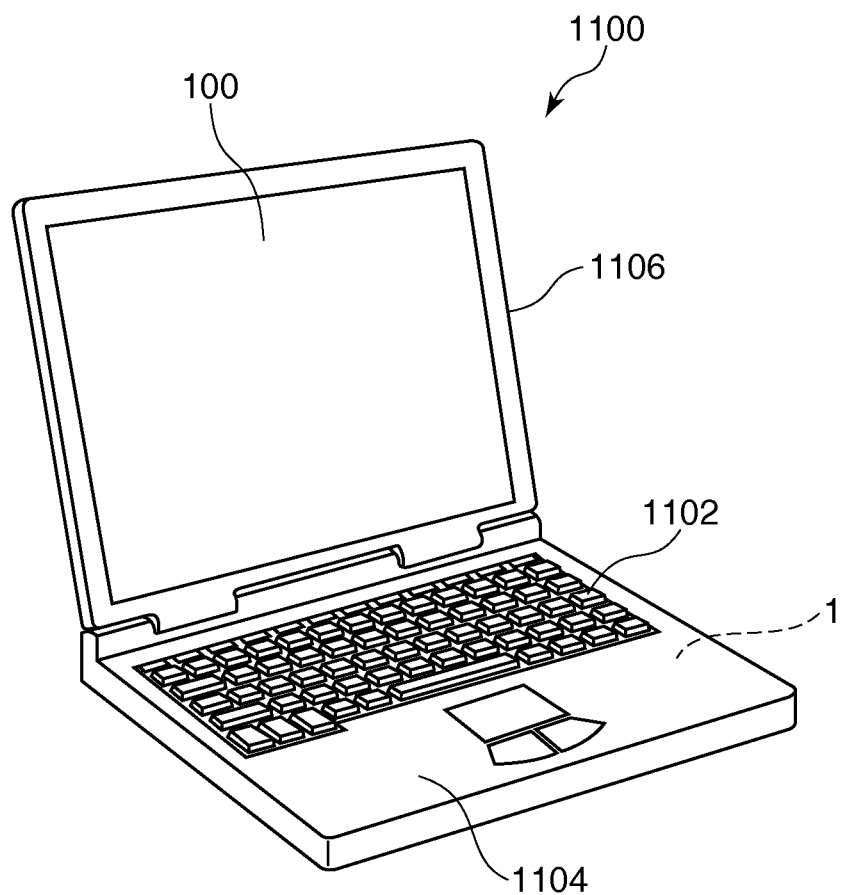
FIG. 7 is a perspective view illustrating a configuration of a mobile type (or notebook type) personal computer to which an electronic apparatus of an embodiment of the invention is applied.

FIG. 7 is a perspective view illustrating a configuration of a mobile type (or a notebook type) personal computer to which the electronic apparatus of the invention is applied.

In this figure, the personal computer 1100 includes a main body portion 1104 having a keyboard 1102 and a display unit 1106 having a display section 100, and the display unit 1106 is rotatably supported to the main body portion 1104 via a hinge structure portion.

The aforementioned sensor device 1 which functions as a gyro sensor is built-in in the personal computer 1100.

Figure 8:
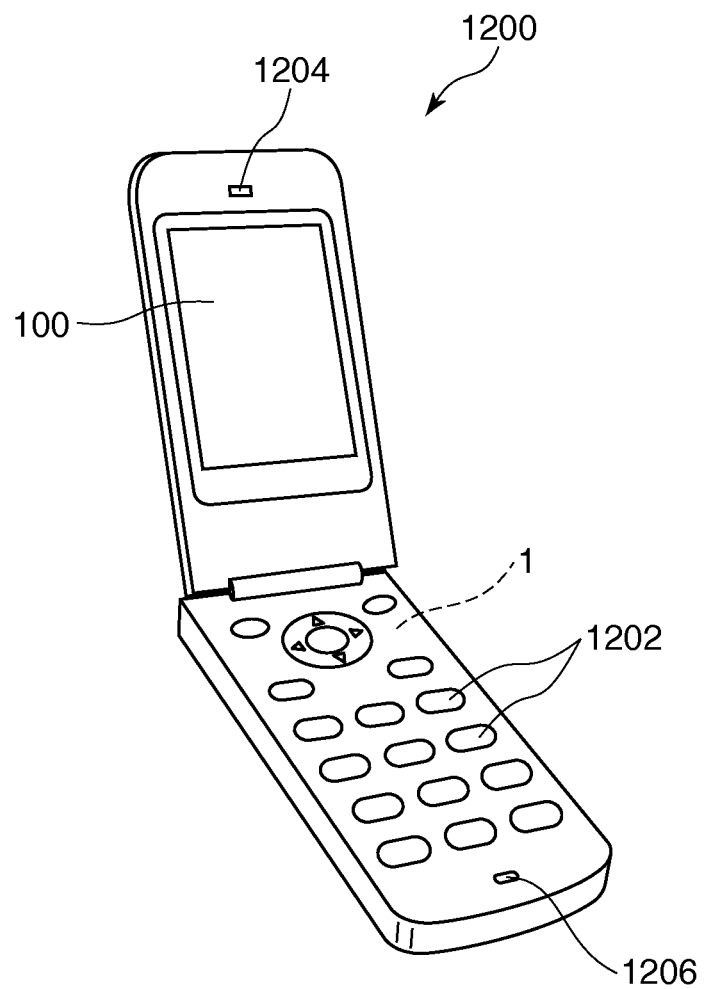
FIG. 8 is a perspective view illustrating a configuration of a mobile phone (including PHS) to which the electronic apparatus of an embodiment of the invention is applied.

FIG. 8 is a perspective view illustrating a configuration of a mobile phone (including a PHS) to which the electronic apparatus of the invention is applied.

In this figure, the mobile phone 1200 has a plurality of operation buttons 1202, an ear piece 1204 and a mouth piece 1206, and a display section 100 is disposed between the operation buttons 1202 and the ear piece 1204.

The aforementioned sensor device 1 which functions as a gyro sensor is built-in in the mobile phone 1200.

Figure 9:
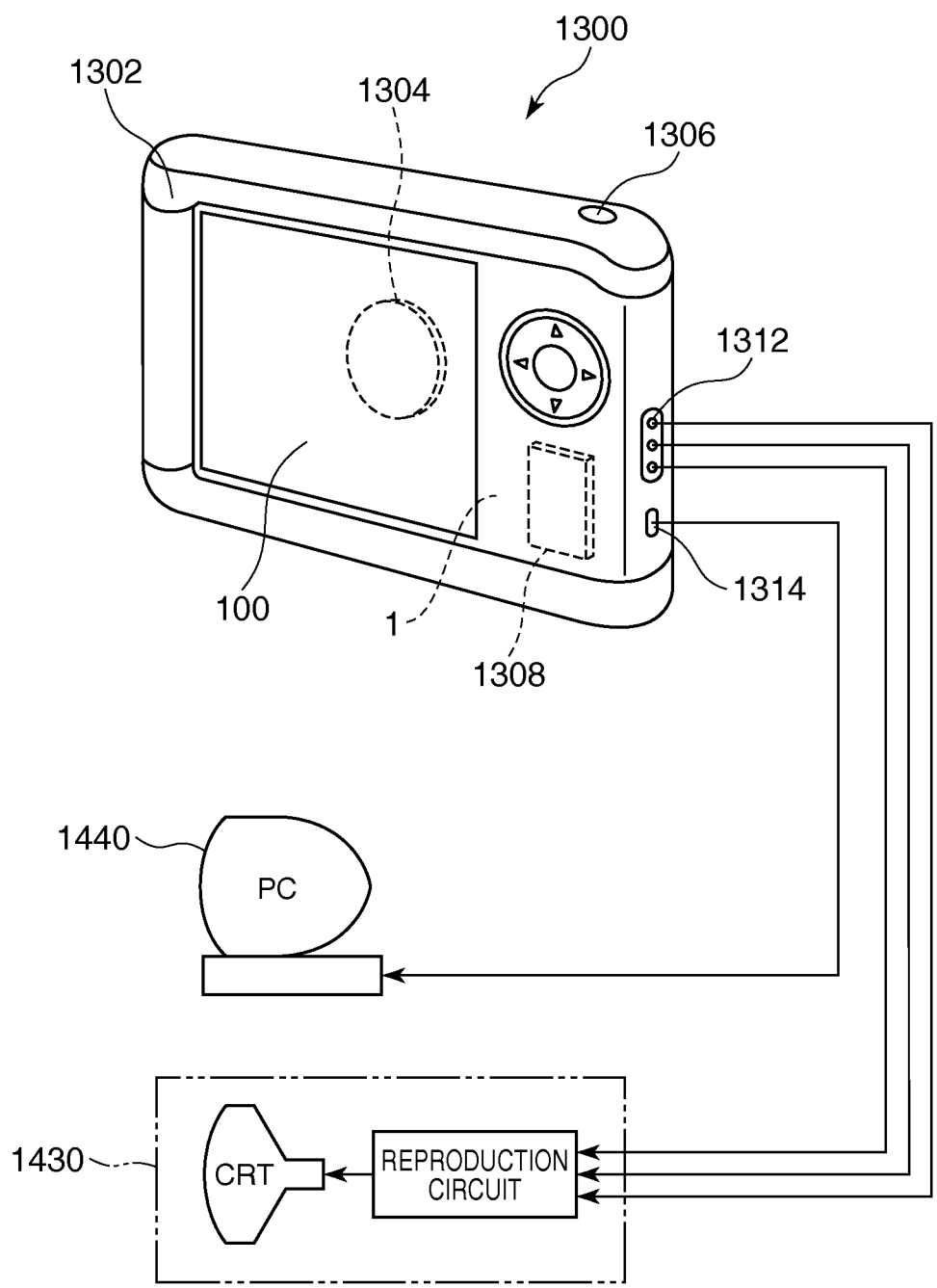
FIG. 9 is a perspective view illustrating a configuration of a digital still camera to which the electronic apparatus of an embodiment of the invention is applied.

FIG. 9 is a perspective view illustrating a configuration of a digital still camera to which the electronic apparatus of the invention is applied. In addition, in this figure, a connection between the camera and an external apparatus is briefly illustrated.

Here, the silver halide photographic film is exposed to form the optical image of an object in a normal camera, whereas the digital still camera 1300 photoelectric-converts the optical image of an object and generates an imaging signal (image signal) by the imaging device such as a CCD (Charge Coupled Device).

In the digital still camera 1300, a display section is provided in the rear surface of the case (body) 1302 and performs a display based on the imaging signal by the CCD. The display section functions as a finder that displays the object as an electronic image.

Further, a light receiving unit 1304 including an optical lens (imaging optical system), a CCD, and the like is provided in the front surface side of the case 1302 (rear surface side in the figure).

The photographer confirms an object image displayed on the display section, and if the photographer presses a shutter button 1306, the imaging signal of the CCD at that moment is transmitted and stored in the memory 1308.

Further, in the digital still camera 1300, a video signal output terminal 1312 and an input and output terminal for data communication 1314 are provided in the side surface of the case 1302.

Then, as shown in the figure, a television monitor 1430 and a personal computer 1440 are respectively connected to the video signal output terminal 1312 and the input and output terminal for data communication 1314 as necessary. Then, by a predetermined operation, the imaging signal stored in the memory 1308 is output to the television monitor 1430 and the personal computer 1440.

The aforementioned sensor device 1 functioning as a gyro sensor is built-in in the digital still camera 1300.

In addition, in addition to the personal computer (mobile personal computer) in FIG. 7, the mobile phone in FIG. 8, the digital still camera in FIG. 9, the electronic apparatus of the invention may be applied to, with the kind of the electronic device, for example, a vehicle body attitude detection apparatus, a pointing device, a head-mounted display, an ink-jet type ejection device (for example, an ink jet printer), a personal laptop computer, a TV, a video camera, a video tape recorder, a navigation device, a pager, an electronic organizer (also with communication function), an electronic dictionary, a calculator, an electronic game device, a game controller, a word processor, a workstation, a videophone, a television monitor for security, an electronic binoculars, a POS terminal, a medical equipment (for example, an electronic thermometer, a blood pressure gauge, a blood glucose meter, an electrocardiogram measuring device, an ultrasonic diagnostic apparatus and an electronic endoscope), a fish finder, various measuring instruments, gauges (for example, gauges of a vehicle, an aircraft and a ship), a flight simulator.

Hitherto, the electronic device and the electronic apparatus of the invention have been described based on the illustrated embodiment, but the invention is not limited thereto. Further, the configuration of each part may be replaced with any configuration which has a similar function, and any configuration may be added thereto.

Further, the electronic device of the invention may be a combination of configurations (features) of any two or more out of each embodiment.

Further, in the aforementioned embodiment, a case where the sensor element is supported in the package through the supporting member configured of the TAB tape has been described as an example, but without being limited thereto, for example, the sensor element may be directly supported with respect to the package.

Further, in the aforementioned embodiment, the case of using the double T type sensor element has been described as an example, but without being limited thereto, the sensor element (gyro element) may be a bipod tuning fork, H type tuning fork, a tripod tuning fork, or various gyro elements such as a comb type gyro element, an orthogonal gyro element, and a prismatic gyro element.

Further, in the aforementioned embodiment, a case where the mounting component provided in the base of the package with the spacer interposed therebetween is the IC chip has been described as an example, but without being limited thereto, for example, the mounting component may be a sensor element.

Further, in the aforementioned embodiment, a case where the IC chip and the sensor element are disposed to overlap in the plan view has been described, but even in the sensor device in which the IC chip and the sensor element are disposed and aligned in the plan view, the effect of the invention (miniaturization of sensor device, and prevention of the decrease in the mechanical strength of the package) may be achieved.

The entire disclosure of Japanese Patent Application No. 2012-096954, filed Apr. 20, 2012 is expressly incorporated by reference herein.

What is claimed is:

1. An electronic device comprising:
   a mounting component;
   a package which includes a base in which the mounting component is provided and houses the mounting component, the base has a main surface and a bottom surface, the base having a through hole provided from the main surface to the bottom surface in a position that overlaps with the mounting component in a plan view;
   a spacer which is provided between the mounting component and the base;
   a circular projection wall which is provided on the main surface of the base and which surrounds the through hole in the plan view;
   a plurality of projection walls which are provided on the main surface of the base of the package, the plurality of projection walls overlapping with the mounting component in the plan view and being spaced apart from each other, wherein
   the plurality of projection walls and the spacer create an air communication between the through hole and an inner space of the package,
   the plurality of projection walls are provided at an interval in a circumferential direction of the through hole in the plan view,
   a height of the circular projection wall is lower that a height of the spacer, and spacer,
   a height of each of the plurality of projection walls is higher than the height of the spacer,
   the plurality of projection walls include a first wall portion that is configured of a plurality of wall bodies that are provided at an interval in the circumferential direction of the through hole in the plan view, and a second wall portion that is provided inside the first wall portion and is configured of a plurality of wall bodies that are provided at an interval in the circumferential direction of the through hole in the plan view,
   at least one of the wall bodies of the first wall portion and the wall bodies of the second wall portion is disposed in a radius direction centered on the through hole in the plan view of the base, and
   the circular projection wall and the plurality of projection walls overlap to each other in directions parallel to the main surface of the base.

2. The electronic device according to claim 1, wherein the plurality of projection walls overlap to each other in any directions perpendicular to a direction of the plan view.

3. The electronic device according to claim 2, wherein at least one of the plurality of projection walls is configured of a metal layer, and
the mounting component is bonded to the at least one of the plurality of projection walls through an adhesive agent.

4. The electronic device according to claim 1, further comprising:
   an adhesive which is provided between the mounting component and the spacer to fix therebetween.

5. The electronic device according to claim 4, wherein the height of the circular projection wall is in a range of ⅓ to ⅔ of the height of the spacer.

6. The electronic device according to claim 1, wherein the mounting component is an IC chip.

7. The electronic device according to claim 6, wherein in the IC chip, a surface on a side opposite to an active surface is fixed to the base with the spacer interposed therebetween.

8. The electronic device according to claim 6, further comprising:
   a sensor element which is housed in the package,
   wherein the IC chip has a function of driving the sensor element.

9. The electronic device according to claim 7, further comprising:
   a sensor element which is housed in the package,
   wherein the IC chip has a function of driving the sensor element.

10. The electronic device according to claim 1, wherein the circular projection wall is in an annular shape that surrounds an entire circumference around the through hole in the plan view.

11. An electronic apparatus comprising the electronic device according to claim 1.

* * * * *